United States Patent [19]
Jen et al.

[11] Patent Number: 5,786,700
[45] Date of Patent: Jul. 28, 1998

[54] METHOD FOR DETERMINING INTERCONNECTION RESISTANCE OF WIRE LEADS IN ELECTRONIC PACKAGES

[75] Inventors: Keh-Chee Jen, San Jose, Calif.; Jan Obrzut, Vestal, N.Y.

[73] Assignee: International Business Machines Corporation, Armonk, N.Y.

[21] Appl. No.: 650,505

[22] Filed: May 20, 1996

[51] Int. Cl.$^6$ .................... G01R 27/08; G01R 31/26
[52] U.S. Cl. .................... 324/713; 324/719; 324/767
[58] Field of Search .................... 324/691, 713, 324/719, 525, 767

[56] References Cited

U.S. PATENT DOCUMENTS

| | | | |
|---|---|---|---|
| 3,996,514 | 12/1976 | Brown et al. | 324/722 |
| 4,301,403 | 11/1981 | Hawkes et al. | 324/767 |
| 4,727,317 | 2/1988 | Oliver | 324/537 |
| 4,779,041 | 10/1988 | Williamson, Jr. | 324/537 |
| 4,779,043 | 10/1988 | Williamson, Jr. | 324/537 |
| 4,853,628 | 8/1989 | Gouldsberry et al. | 324/763 |
| 4,894,605 | 1/1990 | Ringleb et al. | 324/537 |
| 4,896,108 | 1/1990 | Lynch et al. | 324/713 |
| 5,223,798 | 6/1993 | McGinnis et al. | 324/713 |
| 5,280,237 | 1/1994 | Buks | 324/765 |
| 5,365,180 | 11/1994 | Edelman | 324/715 |
| 5,450,016 | 9/1995 | Masumori | 324/713 |
| 5,521,511 | 5/1996 | Lanzi et al. | 324/522 |
| 5,532,600 | 7/1996 | Hoshino | 324/537 |

*Primary Examiner*—Glenn W. Brown
*Attorney, Agent, or Firm*—Arthur J. Samodovitz

[57] ABSTRACT

A process determines a linear interconnection resistance R between two external access points of an electronic device. The device comprises a chip, a chip carrier and wiring between the chip and carrier. The chip comprises an ESD device such as a diode which is electrically connected between the two access points. To begin the process, various currents are injected from one of the access points to another and corresponding voltages are measured across the two access points. Alternately, various voltages are applied from one access point to the other and corresponding currents are measured. The applied voltages and injected currents all forward bias the ESD device. These current-voltage relationships are applied to an interconnection model algorithm to yield the interconnection resistance. The interconnection model algorithm is derived from an interconnection model equation using least squares as a maximum likelihood estimator applied to the interconnection model equation to deliver absolute roots of the interconnection model algorithm. The interconnection model equation models the circuit comprising the interconnection resistance and the ESD device except that the nonlinear parameters of the ESD device is untangled from the linear interconnection resistance.

12 Claims, 3 Drawing Sheets

METHOD FOR DETERMINING INTERCONNECTION RESISTANCE OF WIRE LEADS IN ELECTRONIC PACKAGES

BACKGROUND OF THE INVENTION

The present invention relates generally to electronic packages such as a semiconductor circuit mounted on a chip carrier, and deals more particularly with a method for determining resistance associated with bonding an I/O lead at one end to a semiconductor pad and at the other end to a chip carrier pad.

Semiconductor circuits or "chips" are well known in the industry and comprise semiconductor materials which form transistors, diodes, capacitors, resistors and internal interconnections. However, not all components of an electrical circuit can be integrated into the same chip or any chip for that matter, and chips need external power and ground. After the chip with its semiconductor components is formed, the chip is mounted on a chip carrier and external signal conductors such as I/O wire leads are provided to connect the semiconductor circuit to other semiconductor circuits, discrete components, power and ground. The wire lead is bonded at one end to a chip pad and at the other end to a chip carrier pad.

During development or production, it is important to measure the "interconnection" resistance associated with the I/O wire lead and associated bonds. While the I/O lead itself has predictable and reliable resistance and is not generally a source of concern, occasionally the bonding at either end is faulty. The faulty bonding is either due to an error in the assembly process or subsequent mechanical stress on the lead. A faulty interconnection may be manifested in a high resistance and cause for rejection of this device or modification to the production process.

Accordingly, it is desirable to test the interconnection resistance of each lead including the bonds. The measurement should be taken at exposed/external ends of the leads; it is not practical to make internal measurements at or within the chip. It was known to test a surrogate chip having the same wire leads and bonding as the production chips but a simple metallic path between pairs of wire leads instead of the production circuitry. In this test, a voltage is applied from the exposed end of one wire lead to the exposed end of another wire lead of the same pair and the resultant current is measured. The ratio is the total resistance of the path. It was also known to inject a fixed current from one wire lead to another in a production device containing linear and/or nonlinear elements therebetween and sense current output at this other wire lead to test continuity in the path. However, this technique does not measure the actual resistance in the path.

A general object of the present invention is to provide a method for measuring bonding resistance of a lead interconnecting a production chip and a chip carrier.

A more specific object of the present invention is to provide a method of the foregoing type which does not require internal access to the chip and is applicable to I/O ports having an Electrostatic Discharge Diode (ESD) device such as a diode formed within the chip between two I/O ports.

SUMMARY OF THE INVENTION

The invention resides in a process for determining a linear interconnection resistance R between two external access points of an electronic device. The device comprises a chip, a chip carrier and wiring between the chip and carrier. The chip comprises an ESD device such as a diode which is electrically connected between the two access points. To begin the process, various currents are injected from one of the access points to another and corresponding voltages are measured across the two access points. Alternately, various voltages are applied from one access point to the other and corresponding currents are measured. The applied voltages and injected currents all forward bias the ESD device. These current-voltage relationships are applied to an interconnection model algorithm to yield the interconnection resistance.

The interconnection model algorithm is derived from an interconnection model equation using least squares as a maximum likelihood estimator applied to the interconnection model equation to deliver absolute roots of the interconnection model algorithm. The interconnection model equation models the circuit comprising the interconnection resistance and the ESD device except that the nonlinear parameters of the ESD device are untangled from the linear interconnection resistance.

According to one feature of the invention, the interconnection model equation is based on the following equation where $I_D$, and $V_A$ represent the current and voltage relationships:

$$V_A = \eta \cdot V_T \ln (I_D) + I_D \cdot R + \eta \cdot V_T \ln (1/I_o)$$

wherein $\eta$ is an ideality factor, $V_T$ is thermal voltage and $I_o$ is saturation current.

DETAILED DESCRIPTION OF THE PREFERRED EMBODIMENTS

Figure 1:
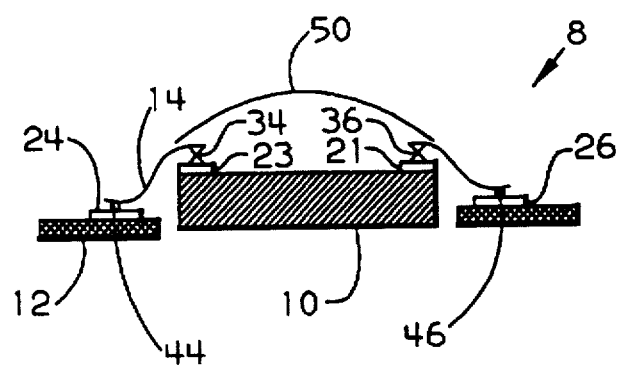
FIG. 1 is a schematic, side view of a prior art chip and chip carrier having wire leads whose bonding resistance is monitored according to the present invention.

Referring now to the drawings in detail wherein like reference numbers indicate like elements throughout, FIG. 1 illustrates a prior art electronic device 8 comprising a semiconductor chip 10 and a chip carrier (or substrate) 12. Chip 10 comprises internal semiconductor components (such as transistors, diodes, resistors and semiconductor paths, not shown) and is mounted on the chip carrier 12. A series of electrical signal leads, including wire leads 14 and 16, are connected along the edges of the chip between respective pads 23 and 21 on the chip and pads 24 and 26 on the chip carrier 12. In the illustrated example, the connections between internal ends of the leads 14 and 16 and the chip pads are made by C4-joints, and the connections between external ends of the leads 14 and 16 and the chip carrier pads are made by eutectic or conductive adhesive 44 and 46. Alternately, the chip can be mounted directly on the surface of a chip carrier and the leads wire bonded or C4 jointed to the chip carrier. A protective coating/encapsulation 50, for example epoxy resin, is provided over the chip 10 (after the leads are soldered at both ends) such that everything except the outer ends of the leads is covered.

In the illustrated example, during normal operation of the electronic device, pad 24 is a signal input, pad 26 is connected to ground and the chip includes an ESD device (such as a diode, not shown in FIG. 1) between leads 14 and 16. The ESD device is oriented to prevent the voltage of signal input port or pad 24 from falling more than 0.7 volts below ground. (If desired, another ESD device can be included between input port 44 and the source of DC voltage and oriented to prevent the voltage of the input pad 24 from rising beyond the nominal source to ground voltage.)

Figure 2:
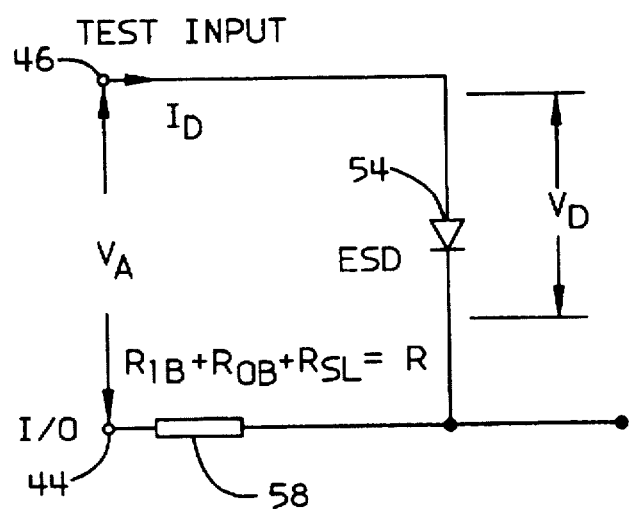
FIG. 2 is a schematic diagram of an equivalent electronic circuit corresponding to the chip and wire leads illustrated in FIG. 1.

FIG. 2 schematically illustrates the circuit between pads 26 and 24 during a test process. A "box" 58 represents the combined "interconnection" resistance (R) between the two access points, in FIG. 1, the inner bonds 34 and 36 (Rib), outer bonds 44 and 46 (Rob), and signal lines (Rsl) between the inner and outer bonds. However, in other package designs, the interconnection resistance can also include photo vias, blind vias, compression bonds, C4 bonds, etc. These signal lines include the series resistance of the metallic leads 14 and 16 and semiconductor signal paths within chip 10. ESD device 54 is located in series with the interconnection resistance R.

The method according to the present invention begins with a series of tests to determine current-voltage relationships between two test points. During each test, a different current is injected into the circuit via pad 26 and simultaneously, the resultant voltage between pads 26 and 24 is measured. (Alternately, during each test, a different voltage is applied from pad 26 to pad 24 forward biassing ESD device 54 and the resultant current is measured.) In practice, these tests are facilitated by a testing head with suitable current sources and voltage meters. The head is lowered over the chip and has complementary pads which make connection with pads 24 and 26. Alternately, a "Hummingbird" robot with a suitable current source and voltage meter can be used to make the current/voltage tests, which robot is described in U.S. Pat. No. 5,180,955 and hereby incorporated by reference as part of the present patent application.

The process of extraction of the interconnection resistance begins with establishing an electrical model of the electrical path. The voltage/current characteristics of the circuit of FIG. 2 are defined as follows:

$$I_D = I_O \left( e^{\frac{V_D}{\eta \cdot V_T}} - 1 \right) \quad (1)$$

where, $V_T$ is the thermal voltage
$V_T = kT/q$;
  q=elementary charge
  K=Boltzman constant
  T=absolute temperature
  At 25° C. $V_T \approx 25.9$ mV
$\eta$=ideality factor
$I_O$=saturation current According to the I/O diagram shown in FIG. 2, $V_D$ can be expressed by measurable parameters $V_A$ and $I_D$ as:

$$V_D = V_A - I_D R \quad (2)$$

where, $I_D$ represents the current injected into pad 26 and $V_A$ is the resultant voltage measured from pad 26 to pad 24 (or $V_A$ is the voltage applied from pad 26 to pad 24 and $I_D$ represents the resultant current from pad 26 to pad 24), and R represents equivalent ohmic resistance 58 of the interconnect. Equations (1) and (2) can be combined into:

$$I_D = I_O \left( e^{\frac{V_A - I_D \cdot R}{\eta \cdot V_T}} - 1 \right) \quad (3)$$

The electrical model of equation (3) is translated into a mathematical expression reflected by the equation (4) where the interconnection resistance is untangled from the nonlinear parameters of the ESD device 54. Accordingly, examination of equation (3) against experimental data indicate that for $V_A \geq 0.3$ V, equation (3) can be simplified into:

$$I_D = I_O \left( e^{\frac{V_A - I_D \cdot R}{\eta \cdot V_T}} - 1 \right) \approx I_O e^{\frac{V_A - I_D \cdot R}{\eta \cdot V_T}} \quad (3')$$

from which $V_A$ is given as a function of the current $I_D$ by equation (4):

$$V_A = \eta \cdot V_T \ln(I_D) + I_D \cdot R + \eta \cdot V_T \ln(1/I_O) \quad (4)$$

Equation (4) represents a mathematical model of an I/O with ESD in the non-entangled form where the equivalent ohmic resistance R, saturation current $I_O$, and $\eta V_T$ are parameters of the model. The interconnection resistance is presented in equation (4) in a linear term $I_D R$ while the remaining parameters $\eta$, $V_T$ and $I_O$ are constrained in the nonlinear terms. Equation (4) eliminates certain difficulties associated with numerical solution of equation (1). It also allows for separation of the I/O parameters with considerable confidence and precision.

A set of experimental current and voltage data is fitted to equation (4) by solving it in respect to unknown R, $\eta$, $V_T$ and $I_O$. Least Squares as Maximum Likelihood Estimator is utilized assuming that the measurement errors are independent and normally distributed with constant standard deviation $\sigma_i$. This approach is known as chi-square statistics:

$$\chi^2 \equiv \sum_{i=1}^{n} \left( \frac{V_{Ai} - V_C(I_{Di}, R, \eta, V_T, I_O)}{\sigma_i} \right)^2 \quad (5)$$

where n is the number of experimental data, $V_{Ai}$ and $I_{Di}$ are measured I/O voltage and current, while $V_C$ is the calculated voltage for $I_{Di}$ according to equation (4). Thus, the mathematical model of equation (4) has been translated into the algorithm reflected by the equation 5, having interconnection parameters expressed as adjustable variables, where the least squares statistics is applied to the current-voltage data points as the maximum likelihood estimator technique. Approximate values of the interconnection resistance and the non-linear parameters of the ESD device have been obtained by searching for a local minimum of the equation (5) numerically, for example the Fletch-Powell method or the Levenberg-Marquardt method can be employed (see W. H. Press "Numerical Recipies in C", Cambridge University Press, 1990, pages 542–547.) Seeking the absolute roots of the equation (5), the matrix (6) of the model is established.

According to the present invention, equation (5) is solved by putting $\chi^2 = 0$ and finding vector parameter of model equation (6) in which the ith voltage $V_{Ci}$ is calculated according to equation (4).

$$\begin{bmatrix} \sum_i (\ln I_{Di})^2 & \sum_i I_{Di} \ln I_{Di} & \sum_i \ln I_{Di} \\ \sum_i I_{Di} \ln I_{Di} & \sum_i I_{Di}^2 & \sum_i I_{Di} \\ \sum_i \ln I_{Di} & \sum_i I_{Di} & n \end{bmatrix} \cdot \begin{bmatrix} \eta V_T \\ R \\ -\eta V_T \ln I_O \end{bmatrix} = \begin{bmatrix} \sum_i V_{Ai} \ln I_{Di} \\ \sum_i V_{Ai} I_{Di} \\ \sum_i V_{Ai} \end{bmatrix} \quad (6)$$

The matrix (6) is solved analytically yielding vector parameters of the model. The components of the model are given by equations 7(a–c):

$$\eta V_T \ln I_O = -\frac{f_3 - m\frac{f_1}{k} - \left(f_2 - l\frac{f_1}{k}\right)\frac{p - \frac{ml}{k}}{t - \frac{l^2}{k}}}{n - \frac{m^2}{k} - \frac{\left(p - \frac{ml}{k}\right)^2}{t - \frac{l^2}{k}}} \quad (7a)$$

$$R = \frac{f_2 - l\frac{f_1}{k} - \eta V_T \ln I_O \left(p - \frac{ml}{k}\right)}{t - \frac{l^2}{k}} \quad (7b)$$

$$\eta V_T = \frac{f_1}{k} - R\frac{l}{k} - \eta V_T \ln I_O \frac{m}{k} \quad (7c)$$

Parameters f, k, l, m, p and t are introduced to equations 7(a–c) as follows:

$$f_1 = \sum_{i=1}^{n} V_{Ai} \ln I_{Di} \quad 8(a)$$

$$f_2 = \sum_{i=1}^{n} V_{Ai} I_{Di} \quad 8(b)$$

$$f_3 = \sum_{i=1}^{n} V_{Ai} \quad 8(c)$$

$$k = \sum_{i=1}^{n} (\ln I_{Di})^2 \quad 8(d)$$

$$l = \sum_{i=1}^{n} I_{Di} \ln I_{Di} \quad 8(e)$$

$$m = \sum_{i=1}^{n} \ln I_{Di} \quad 8(f)$$

$$p = \sum_{i=1}^{n} I_{Di} \quad 8(g)$$

$$t = \sum_{i=1}^{n} I_{Di}^2 \quad 8(h)$$

Figure 3:
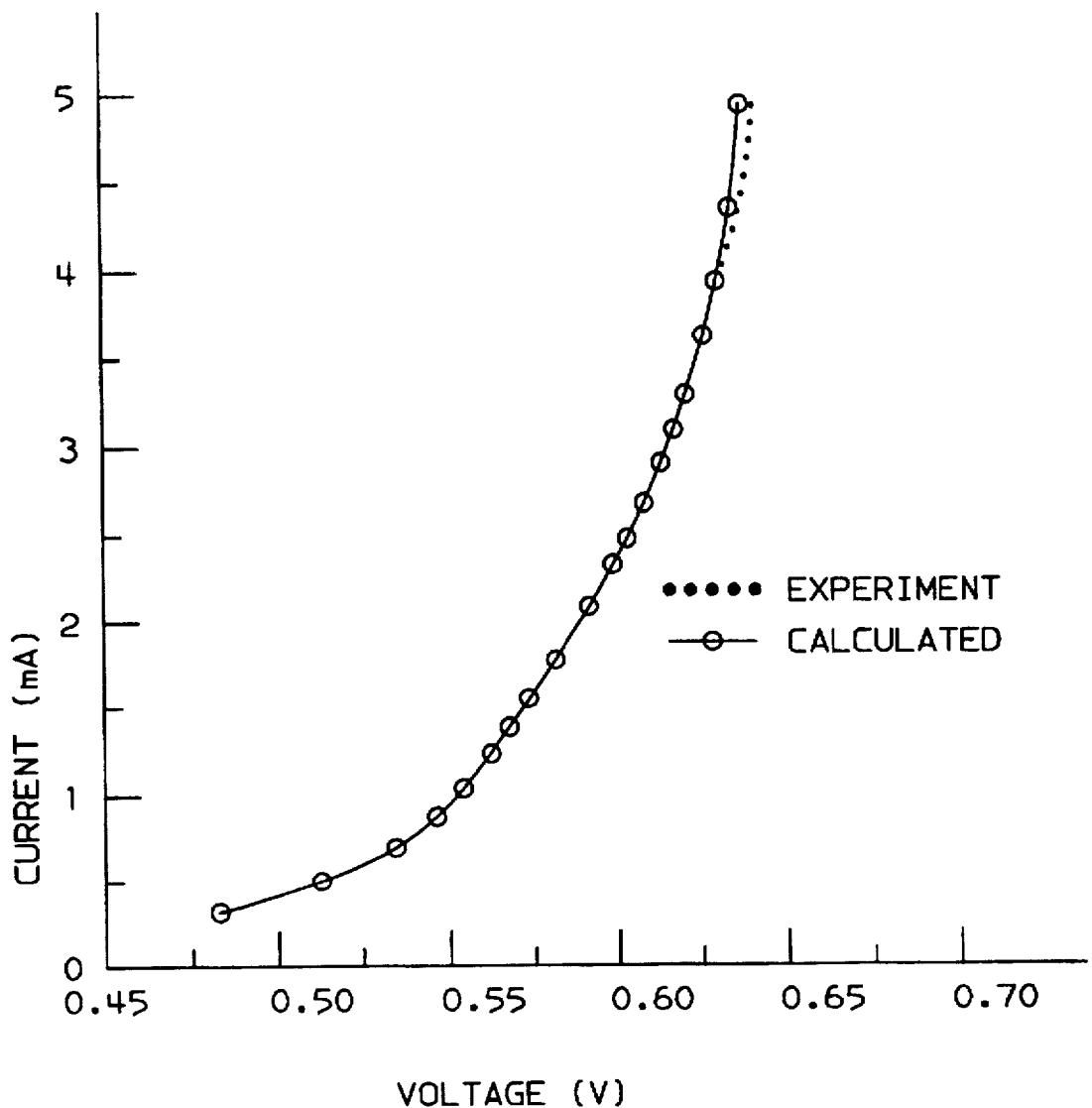
FIG. 3 is a graph illustrating experimental current-voltage readings compared to data calculated according to the present invention.

Equations 7(a–c) and 8(a–h) represent direct solution of the interconnection mathematical model. As before, R is the interconnection equivalent ohmic resistance, $I_O$ represents saturation current, while $\eta$ and $V_T$ are ideality factor and thermal voltage respectively. These parameters can be calculated from equations (7) and (8) for a given number n of test current injections ($I_{Di}$) and corresponding voltage $V_{DU}$ readings which are illustrated in FIG. 3. In the example of FIG. 3, the interconnection resistance R equals 3.661 ohms, $I_O$ equals 11.9 nanoamps, $\eta$ is 1.86 ideality factor and $V_T$ equals 29.7 millivolts.

Figure 4:
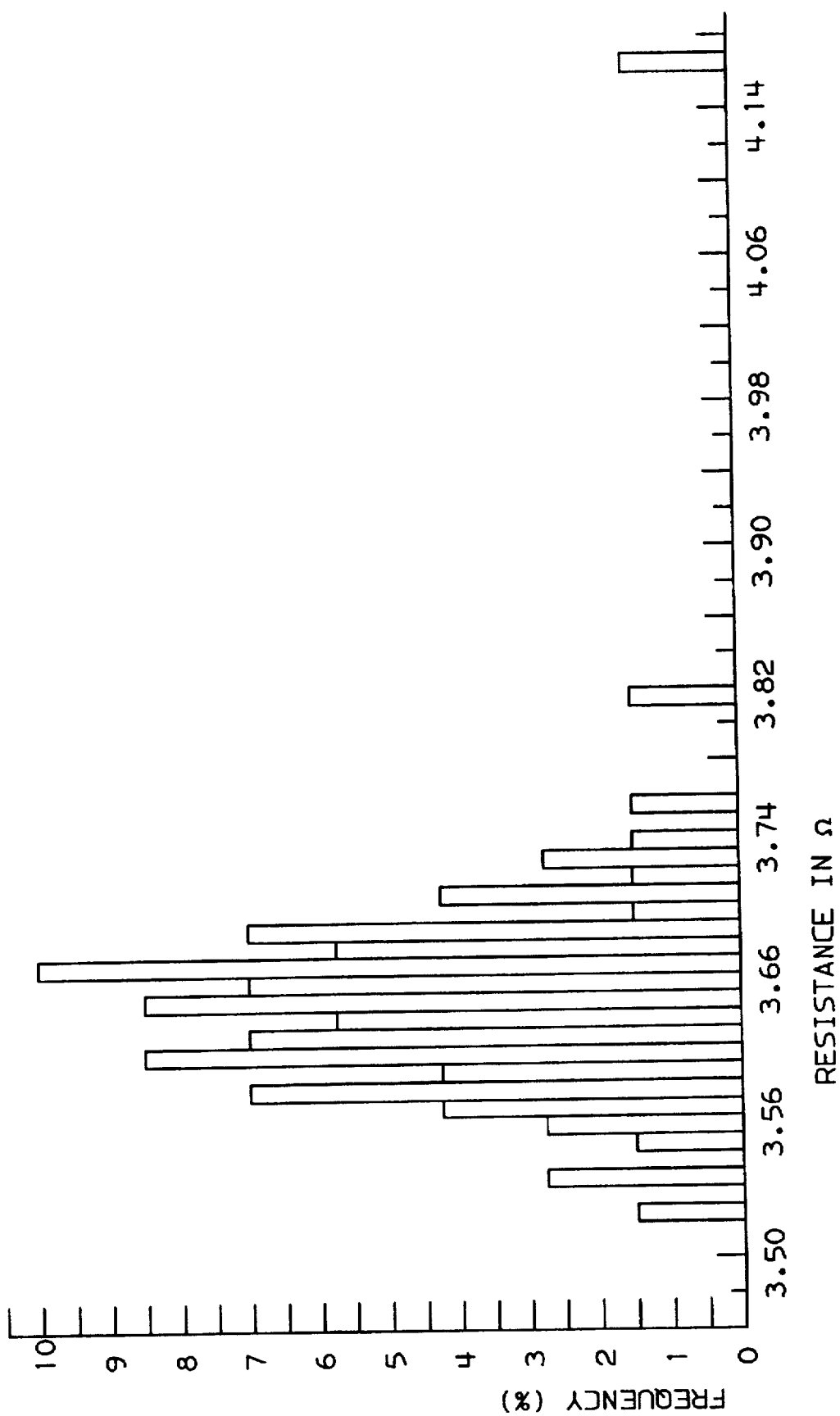
FIG. 4 is a histogram illustrating interconnection resistance R calculated according to the present invention.

The interconnection resistance R can be used to monitor production units by comparing the R value with a preset upper limit; if the value obtained is less than the limit then the unit passes the test. Otherwise, the unit fails the test. Also, this technique is well suited to monitor aging of the interconnection bonding during accelerated stress testing, where modules are subjected to various environmental and/or mechanical stresses. Module interconnection resistance R can be monitored and compared to the R value before, during and after the stress testing. Mechanically weak interconnections tend to manifest themselves with a higher resistance R after stressed. Thus, with the fine resistance resolution obtained from the techniques described above, modules with unreliable interconnections can be readily screened-out, as shown by the uppermost value in FIG. 4.

Based on the foregoing, a process for determining the resistance associated with bonding an I/O lead at one end to a chip pad and at the other end to a chip carrier pad has been disclosed. However, numerous modifications and substitutions can be made without deviating from the scope of the present invention. For example, the process can also be used to determine interconnection resistance at other package levels. Therefore, the present invention has been disclosed by way of illustration and not limitation and reference should be made to the following claims to determine the scope of the present invention.

We claim:

1. A method for determining a linear interconnection resistance R of a circuit, said circuit comprising a nonlinear ESD device in series with said interconnection resistance, said method comprising the steps of:

obtaining a multiplicity of different current—voltage relationships for currents flowing in said circuit and respective voltages across said circuit, said currents and voltages all forward biasing said ESD device; and applying said current—voltage relationships to an interconnection model algorithm to yield said interconnection resistance; and wherein said interconnection model algorithm is derived from an interconnection model equation using least squares as a maximum likelihood estimator applied to the interconnection model equation to deliver absolute roots of the interconnection model algorithm, said interconnection model equation modeling said circuit such that a nonlinear parameter of said ESD device is untangled from said linear interconnection resistance.

2. A method as set forth in claim 1 wherein said ESD device is a diode.

3. A method for determining interconnection resistance R of a circuit, said circuit comprising a forward biased ESD device in series with said interconnection resistance, said method comprising the steps of:

measuring a multiplicity of different $I_D$ current—$V_A$ voltage relationships for currents $I_D$ flowing in said circuit and respective voltages $V_A$ across said circuit; and solving the following equation using a least square as maximum likelihood estimator technique for a difference between said voltages and other voltages calculated by said equation for a multiplicity of the different currents:

$$V_A = \eta \cdot V_T \ln (I_D) + I_D \cdot R + \eta \cdot V_T \ln (1/I_o)$$

wherein $\eta$ is ideality factor, $V_T$ is thermal voltage, and $I_O$ is saturation current.

4. A method as set forth in claim 3 wherein the least square as maximum likelihood estimator technique for a difference between the first said voltages and said other voltages calculated by said equation for a multiplicity of the different currents is based on the following:

$$\chi^2 \equiv \sum_{i=1}^{n} \left(\frac{V_{Ai} - V_C(I_{Di}, R, \eta, V_T, I_O)}{\sigma_i}\right)^2$$

where n is a number of measured $I_D$ current—$V_A$ voltage relationships, $V_{Ai}$ are measured voltages $V_A$, $I_{Di}$ are measured currents $I_D$, $V_C$ is the calculated voltage for $I_{Di}$ according to said equation.

5. A method as set forth in claim 3 wherein said circuit comprises a circuit chip mounted on a chip carrier, first and second wire leads serving as inputs or outputs of said chip, first and second pad bonds bonding said first and second wire leads to respective pads on said chip carrier and first and second chip bonds bonding said first and second wire leads to respective pads on said chip.

6. A method as set forth in claim 3 wherein a multiplicity of different currents $I_D$ corresponding respectively to said multiplicity of different $I_D$ current—$V_A$ voltage relationships, are injected into said circuit and the first said voltages $V_A$ are developed across said circuit as a result of said multiplicity of different injected currents.

7. A method as set forth in claim 3 wherein the first said voltages are applied across said circuit and a multiplicity of different currents $I_D$ corresponding respectively to said multiplicity of different $I_D$ current—$V_A$ voltage relationships, result from said applied voltages.

8. A method as set forth in claim 3 wherein said ESD device is a diode.

9. A method as set forth in claim 8 wherein said circuit comprises a chip circuit mounted on a chip carrier, first and second wire leads serving as inputs or outputs of said chip circuit, first and second pad bonds bonding said first and second wire leads to respective pads on a substrate and first and second chip bonds bonding said first and second wire leads to respective pads on said chip circuit.

10. A method for determining interconnection resistance R of a circuit, said circuit also comprising a forward biased ESD device in series with said interconnection resistance, said method comprising the steps of:

injecting a multiplicity of different currents into said circuit and measuring respective voltages developed across said circuit as a result of said multiplicity of different currents; and solving the following equations using pairs of injected current values $I_D$, and resultant voltage measurements $V_{Ai}$:

$$\eta V_T \ln I_o = - \cfrac{f_3 - m\cfrac{f_1}{k} - \left(f_2 - l\cfrac{f_1}{k}\right)\cfrac{p - \cfrac{ml}{k}}{t - \cfrac{l^2}{k}}}{n - \cfrac{m^2}{k} - \cfrac{p - \cfrac{ml}{k}}{t - \cfrac{l^2}{k}}}$$

$$R = \cfrac{f_2 - l\cfrac{f_1}{k} - \eta V_T \ln I_o \left(p - \cfrac{ml}{k}\right)}{t - \cfrac{l^2}{k}}$$

$$\eta V_T = \frac{f_1}{k} - R\frac{l}{k} - \eta V_T \ln I_o \frac{m}{k}$$

$$f_2 = \sum_{i=1}^{n} V_{Ai} I_{Di}$$

$$k = \sum_{i=1}^{n} (\ln I_{Di})^2$$

$$m = \sum_{i=1}^{n} \ln I_{Di}$$

$$t = \sum_{i=1}^{n} I_{Di}^2$$

$$f_1 = \sum_{i=1}^{n} V_{Ai} \ln I_{Di}$$

$$f_3 = \sum_{i=1}^{n} V_{Ai}$$

$$l = \sum_{i=1}^{n} I_{Di} \ln I_{Di}$$

$$p = \sum_{i=1}^{n} I_{Di}$$

wherein n is a number of injected currents, $I_O$ represents substrate saturation current, $\eta$ is ideality factor and $V_T$ is thermal voltage.

11. A method as set forth in claim 10 wherein said ESD device is a diode.

12. A method for determining interconnection resistance R of a circuit, said circuit comprising a forward biased ESD device in series with said interconnection resistance, said method comprising the steps of:

measuring a multiplicity of different $I_D$ current—$V_A$ voltage relationships for currents $I_D$ flowing in said circuit and respective voltages $V_A$ across said circuit; and solving an equation based on the following equation using a least square as maximum likelihood estimator technique for a difference between said voltages and other voltages calculated by the solved equation for a multiplicity of the different currents:

$$V_A = \eta \cdot V_T \ln (I_D) + I_D \cdot R + \eta \cdot V_T \ln (1/I_o)$$

wherein $\eta$ is ideality factor, $V_T$ is thermal voltage, and $I_O$ is saturation current.

* * * * *